United States Patent
Schroeder et al.

(10) Patent No.: US 7,106,233 B2
(45) Date of Patent: Sep. 12, 2006

(54) INTEGRATED GALVANOMAGNETIC SENSOR ARRAY SYSTEM

(75) Inventors: Thaddeus Schroeder, Rochester Hills, MI (US); Jose Alberto Guerra, Chih (MX)

(73) Assignee: Delphi Technologies, Inc., Troy, MI (US)

( * ) Notice: Subject to any disclaimer, the term of this patent is extended or adjusted under 35 U.S.C. 154(b) by 219 days.

(21) Appl. No.: 10/354,294

(22) Filed: Jan. 30, 2003

(65) Prior Publication Data
US 2004/0150385 A1 Aug. 5, 2004

(51) Int. Cl.
*H03M 1/00* (2006.01)

(52) U.S. Cl. ................ 341/141; 324/71.3

(58) Field of Classification Search .............. 341/141; 73/862.333; 338/32 H, 32 R; 324/207.21, 324/117 H, 127, 71.3, 207.2, 454, 207
See application file for complete search history.

(56) References Cited

U.S. PATENT DOCUMENTS

| | | | | |
|---|---|---|---|---|
| 4,578,692 A | * | 3/1986 | Higgs et al. ............... 257/420 |
| 4,782,302 A | * | 11/1988 | Bastasz et al. ............ 324/71.3 |
| 4,875,011 A | * | 10/1989 | Namiki et al. ............. 324/251 |
| 5,166,685 A | * | 11/1992 | Campbell et al. .......... 341/141 |
| 5,448,172 A | * | 9/1995 | Dechene et al. ........... 324/454 |
| 5,530,345 A | * | 6/1996 | Murari et al. ............ 324/207.2 |
| 5,543,988 A | * | 8/1996 | Brady et al. ............... 360/112 |
| 5,963,679 A | * | 10/1999 | Setlak ........................ 382/312 |
| 5,980,246 A | * | 11/1999 | Ramsay et al. ................. 433/5 |
| 5,991,467 A | * | 11/1999 | Kamiko ...................... 382/312 |
| 6,069,470 A | * | 5/2000 | Salatino et al. ............. 382/124 |
| 6,097,183 A | | 8/2000 | Goetz et al. |
| 6,201,466 B1 | | 3/2001 | Schroeder |
| 6,232,770 B1 | | 5/2001 | Schroeder ............. 324/207.21 |
| 6,291,989 B1 | | 9/2001 | Schroeder ............. 324/207.21 |
| 6,307,365 B1 | * | 10/2001 | Santos et al. .......... 324/207.12 |
| 6,466,004 B1 | * | 10/2002 | Rogers et al. .......... 324/117 H |
| 6,486,656 B1 | | 11/2002 | Schroeder ............. 324/207.21 |
| 6,486,659 B1 | | 11/2002 | Schroeder ............. 324/207.21 |
| 6,612,404 B1 | * | 9/2003 | Sweet et al. ............... 187/395 |
| 6,630,882 B1 | | 10/2003 | Heremans et al. ........ 338/32 H |
| 6,631,201 B1 | * | 10/2003 | Dickinson et al. ......... 382/124 |
| 6,776,058 B1 | * | 8/2004 | Schroeder ............. 73/862.333 |
| 6,859,199 B1 | * | 2/2005 | Shi ............................ 345/166 |

OTHER PUBLICATIONS

Research Disclosure, 453052 *Method of digitizing sensor array signals*, Jan. 2002 (pp. 30-31).
Micronas Data Sheet for HAL805 Programmable Linear Hall Effect Sensor, Edition Aug. 16, 2002.

* cited by examiner

*Primary Examiner*—Rexford Barnie
*Assistant Examiner*—Joseph Lauture
(74) *Attorney, Agent, or Firm*—Paul L. Marshall

(57) ABSTRACT

Galvanomagnetic sensor array system and method for providing data interface to a basic sensor array are provided. The sensor system includes an array of galvanomagnetic elements, and a processor coupled to receive each output signal from the array of galvanomagnetic elements. The processor and array of galvanomagnetic elements are integrated in a single semiconductor die.

8 Claims, 4 Drawing Sheets

INTEGRATED GALVANOMAGNETIC SENSOR ARRAY SYSTEM

BACKGROUND OF THE INVENTION

Many kinds of measurements may not be satisfactorily performed with discrete galvanomagnetic sensors comprising a single, or even dual sensing elements. In general, the accuracy of a measurement can be greatly improved by the use of sensor arrays. Furthermore, a sensor array is conducive to a fault tolerant and/or a fail-soft sensing system. Although optical sensor arrays are well known and readily available, generally, they are not suitable for automotive or other industrial applications exposed to a dirty environment.

As disclosed in U.S. Pat. No. 6,201,466, titled, "Magnetoresistor Array", commonly assigned to the same assignee of the present invention, the inventor of the present invention has demonstrated a state-of-the-art magnetoresistor array that provides superior resolution and improved sensing capability. The foregoing patent innovatively addresses integrated-circuit topologies that have enabled the integration in a single die of a magnetoresistor array.

A user-programmable microprocessor or digital signal processor (DSP) would be desirable to process the data from the sensor array so that any unique processing needs may be appropriately addressed, without having to undergo any expensive and time-consuming redesign and/or retesting of the sensor array. For example, this DSP may be configured with appropriate algorithms for specific sensing tasks. The sensor manufacturer could include a family of some standard algorithms in the DSP. However, it is envisioned that end users could also develop and employ their own customized algorithms, which would allow them to create a uniquely configured sensor array using essentially the same sensor array hardware purveyed by the sensor array manufacturer.

Accordingly, for certain applications, it may be desirable to offer a single chip solution that embeds both the sensor array and the DSP. For these applications there is a need of providing a compact and relatively inexpensive array of galvanomagnetic sensors and processor integrated on a single semiconductor die. For other applications, where a DSP may be externally available to the end user, it would be particularly desirable to provide data interface techniques that would allow reducing the number of interface pins of the chip. It would be further desirable to provide data interface techniques that would allow the user to implement reliable and accurate data transfer between the sensor array and any external DSP. It would be further desirable to provide signal conversion techniques appropriately matched to the specific dynamic range provided by the sensor array.

BRIEF SUMMARY OF THE INVENTION

Generally, the present invention fulfills the foregoing needs by providing in one aspect thereof, a galvanomagnetic sensor array system that comprises an array of galvanomagnetic elements, and a processor coupled to receive each output signal from the array of galvanomagnetic elements, wherein the processor and array of galvanomagnetic elements are integrated in a single semiconductor die.

In another aspect thereof, the present invention further fulfills the foregoing needs by providing a method for providing data interface between a galvanomagnetic sensor array integrated in a semiconductor die and an externally connected processor. The method allows providing a first pin in the die dedicated to receive an address signal indicative of a respective galvanomagnetic element of the sensor array selected to provide an output signal to the processor. The method further allows providing a second pin in the die dedicated to pass the output signal from the selected galvanomagnetic element to the processor.

A second embodiment of the data interface method allows providing a pin in the die to receive during a first time interval an address signal indicative of a respective galvanomagnetic element of the sensor array selected to provide an output signal to the processor. During a second time interval, this embodiment allows passing through the same pin the output signal from the selected galvanomagnetic element to the processor.

A third embodiment of the data interface method allows providing a pin in the die for passing to the externally connected processor a scan of samples from each galvanomagnetic element of the sensor array. This embodiment further allows configuring each scan of samples to uniquely associate each scan sample with a respective element of the sensor array.

BRIEF DESCRIPTION OF THE DRAWINGS

The features and advantages of the present invention will become apparent from the following detailed description of the invention when read with the accompanying drawings in which.

DETAILED DESCRIPTION OF THE INVENTION

Figure 1:
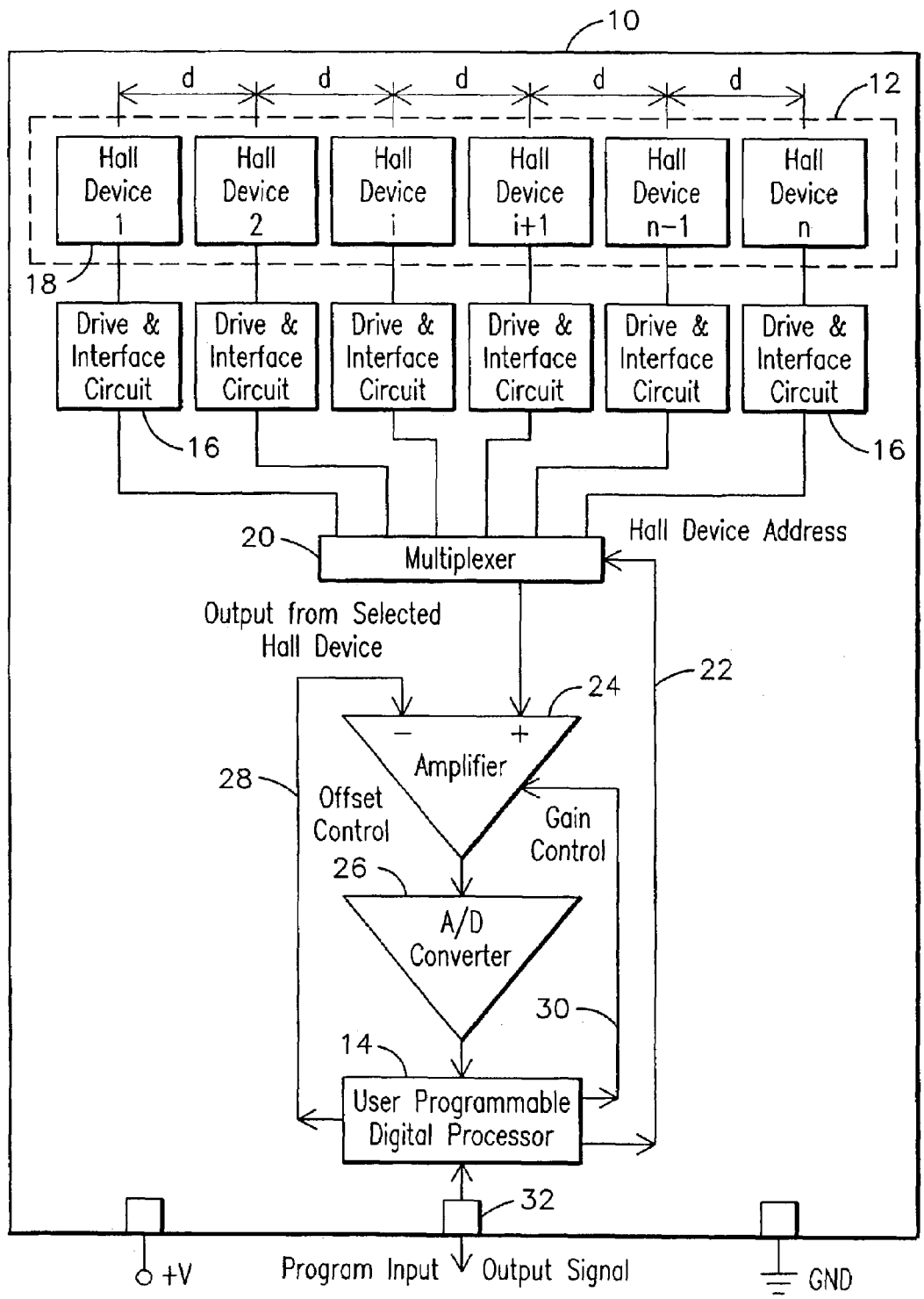
FIG. 1 is a functional block diagram of an exemplary integrated sensing system solution that comprises a galvanomagnetic sensor array, and a user-programmable processor monolithically constructed on a single integrated-circuit chip.

FIG. 1 is a functional block diagram of an exemplary integrated sensing system solution 10 that comprises a galvanomagnetic sensor array 12, and a user-programmable processor 14, e.g., a DSP, constructed on a single integrated-circuit chip. The sensing system 10 may further comprise respective drive and interface circuits 16 for each sensing element 18 that makes up sensor array 12. A multiplexer 20, e.g., a multiplexed analogue switch responsive to a sensor select signal 22 from DSP 14, allows passing the output signal from any selected sensing element to an amplifier 24 to receive any desired signal amplification. Signal conversion may then be performed on the amplified signal from amplifier 24 by way of an analogue-to-digital converter 26. As will be appreciated by those skilled in the art, a galvanomagnetic sensor refers to any sensor based on electrical phenomena that occurs when a current-carrying conductor or semiconductor is subject to a magnetic field. Examples of galvanomagnetic sensors include Hall and magnetoresistor devices. For example, the embodiment of FIG. 1 uses an n-element array of Hall devices or elements 18, where n might comprise from 8 to 16 Hall elements with a spacing d ranging from approximately 0.3 mm to 0.1 mm. The foregoing embodiment assumes that the array is constructed to fit on a die no wider than approximately 3.0 mm. This embodiment further assumes that a standard 3-pin package is used. It will be understood that the present invention is not limited either to the specific number of sensing elements shown in FIG. 1, or the specific dimensions discussed above since different sensor array arrangements may be configured to meet the needs of any given application.

Circuitry of presently available linear Hall sensors that may be unitarily integrated in a chip, such as the HAL805 sensor available from Micronas and devices with similar functionality as may be available from other purveyors, tend to be complex. Each unitary sensor is designed to provide accurate magnetic field measurements over a broad operating temperature range. Much of the complexity is needed to meet the accuracy and temperature stability requirements. By way of comparison, a sensor array embodying aspects of the present invention need not measure any absolute values of the magnetic field. For example, DSP 14 may use algorithms matched to target shapes to compute the location of selected target features from a pattern of signals of the array. This means that signals indicative of relative field strength values may be conveniently used, in lieu of absolute values. Hence, the individual Hall elements of the array can vary with temperature, provided they are appropriately matched and generally track each other. However, in the event sensor compensation based on an initial calibration is acceptable, e.g., the compensation may be performed at specified magnetic field levels, Bmin and Bmax, over a temperature range of Tmin and Tmax, then the array of elements would not even have to be matched. In this case, individual calibration values may be stored in a memory and would be directly used by the algorithm for computing the target position.

Aspects of the present invention may be used for advantageously simplifying the analogue-to-digital (A/D) conversion process. More particularly since, as suggested above, absolute values are not needed in a sensor array, a common amount of DC bias that may be present in the Hall element signals can be subtracted as an offset voltage 28 in amplifier 24. DSP 14 may be configured to control the magnitude of the offset voltage signal applied to the inverting terminal of amplifier 24. The A/D conversion process may be simplified by performing the A/D conversion just over the dynamic range of the array signals. Furthermore, a variable gain control signal 30 may be provided to amplifier 24 from DSP 14 to selectively match the dynamic range of the array signals to the range of the A/D converter. The net result is a faster and more accurate conversion with utilization of just an appropriate number of bits. For example, if under a given set of operational conditions the dynamic range of the sensor calls for just a six-bit conversion, then there is no need to allocate more than six bits for that condition. If the dynamic range under a different set of operational conditions then calls for eight-bit conversion, then for this condition an additional two bits would be allocated for the conversion and no loss of resolution would occur. The control provided by DSP 14 through multiplexer 20 flexibly allows asynchronous random access to each of the array elements. As suggested above, DSP 14 may be programmed with appropriate algorithms for computing the target position. As shown in FIG. 1, DSP 14 may provide a single pin 32 configured to share both program code input and signal output. As will be readily appreciated by those skilled in the art, the shared pin approach is conducive to alleviate packaging size constraints of the sensor array chip since reduction of even a single pin in the die of a microsensor array would provides some welcome incremental relief to the die designer.

Thus, the inventor of the present invention, in some aspects thereof, has innovatively recognized that a single chip array sensor integrated with a user-programmable digital processor may advantageously function as a basic and universal building block for a broad variety of high accuracy sensing applications. This approach would enable users to convert the basic building block into a uniquely configured sensing device by employing their own custom algorithms. That is, the same sensor array architecture and hardware purveyed by the sensor array manufacturer may be uniquely configurable by each user to meet the individualized sensing needs of any given application.

Other aspects of the present invention, however, contemplate a need for a simple and relatively inexpensive galvanomagnetic sensor arrays without the integrated digital signal processor. For example, many control subsystems may already include one or more microprocessors or DSPs and would just need the basic sensor array. That is, a sensor array 12 electrically coupled to the respective drive and interface circuits 16, each of which is in turn electrically coupled to multiplexer 20. There are also sensing applications that may require multiple sensor arrays, but only one signal processor, e.g. steering wheel position sensors, torque sensors, etc. One may even envision an application, where a fully integrated sensor array including an internal DSP, such as the embodiment illustrated in FIG. 1 would be operable with an externally connected basic sensor array. Examples of such basic sensor arrays are respectively depicted in FIGS. 2 through 4.

As further described below, there are several exemplary data interface techniques that may be used with the basic sensor array to interface with external control devices, such as the external DSP. The embodiments of FIGS. 2 and 3 each allow control to the external DSP through multiplexer 20, with the external signal processor providing asynchronous random access to the array elements. Alternatively, the interface technique depicted in FIG. 4 may allow for continuously scanning each of the sensing elements and to sequentially output their individual output signals. It will be appreciated that in the latter interface technique, the scanning of the output signals would be particularly configured to permit identifying the specific array elements that generated the output signals. That is, the scanning is configured to uniquely associate each scanned signal to a respective sensing element. For example, the digital processor may need this unique information for computing the target position.

Figure 2:
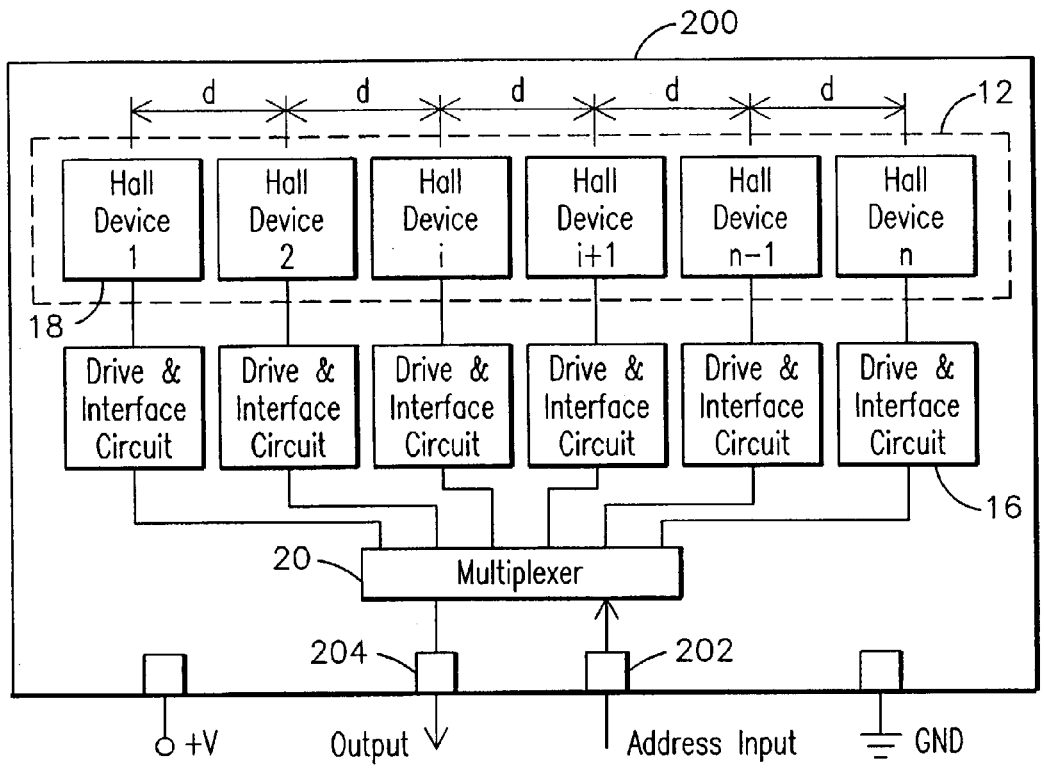
FIG. 2 is a schematic representation of an exemplary sensing interface arrangement with a sensor array that includes separate interface pins for address input and signal output.

FIG. 2 comprises an exemplary sensing interface arrangement 200 with a sensor array that includes separate interface pins 202 and 204 for address input and signal output. Although the interface technique of FIG. 2 uses a package with a total of four pins, this technique may offer a relatively simpler design and a higher degree of operational flexibility, e.g., it permits a continuous connection to any one sensing element for any desired period of time, which might be desirable in certain types of measurements. Incidentally, the fully integrated sensor of FIG. 1 also offers this interface capability, which further underscores its potential role as a universal sensor building block.

Figure 3:
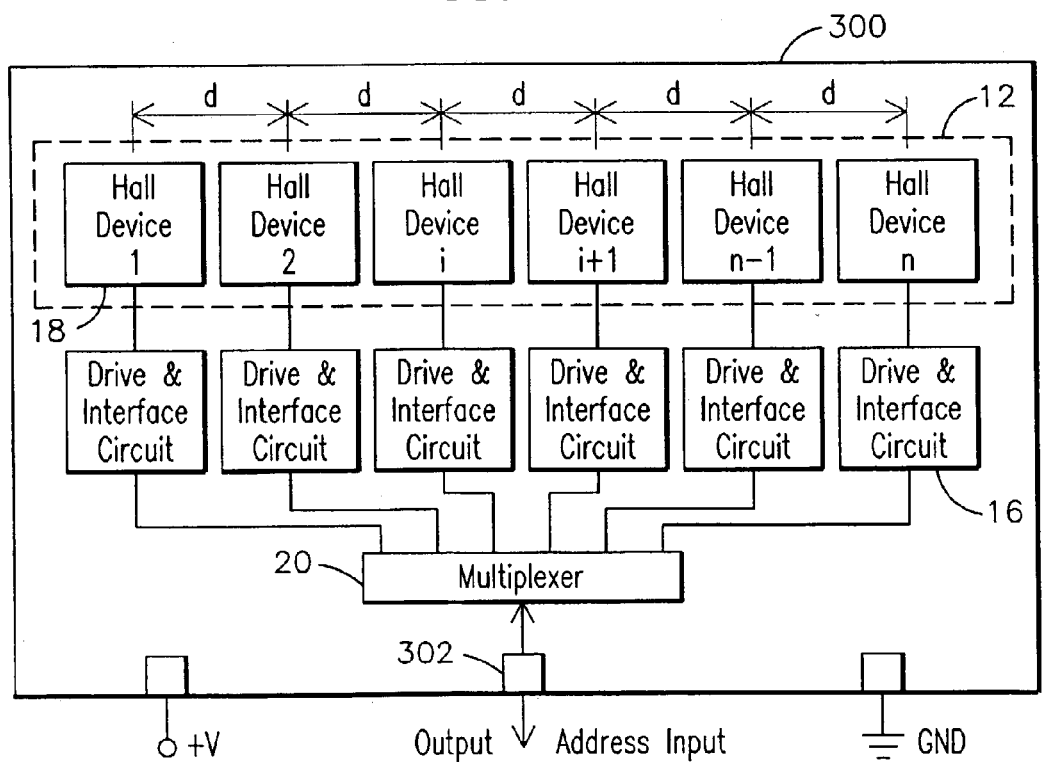
FIG. 3 is a schematic representation of another exemplary sensing interface arrangement with a sensor array that shares a common interface pin for address input and signal output.

FIG. 3 comprises another exemplary sensing interface arrangement 300 with a sensor array that shares a common interface pin 302 for address input and signal output. An exemplary operation of a sensor array with a shared address and signal output pin may be as follows:

1. In a default state, multiplexer 20 may be configured to wait for an address signal. The format of the address signal could be any appropriate digital or analogue format, such as a serial digital signal 310 (FIG. 5), or a pulse width coded (PWC) signal.

Figure 5:
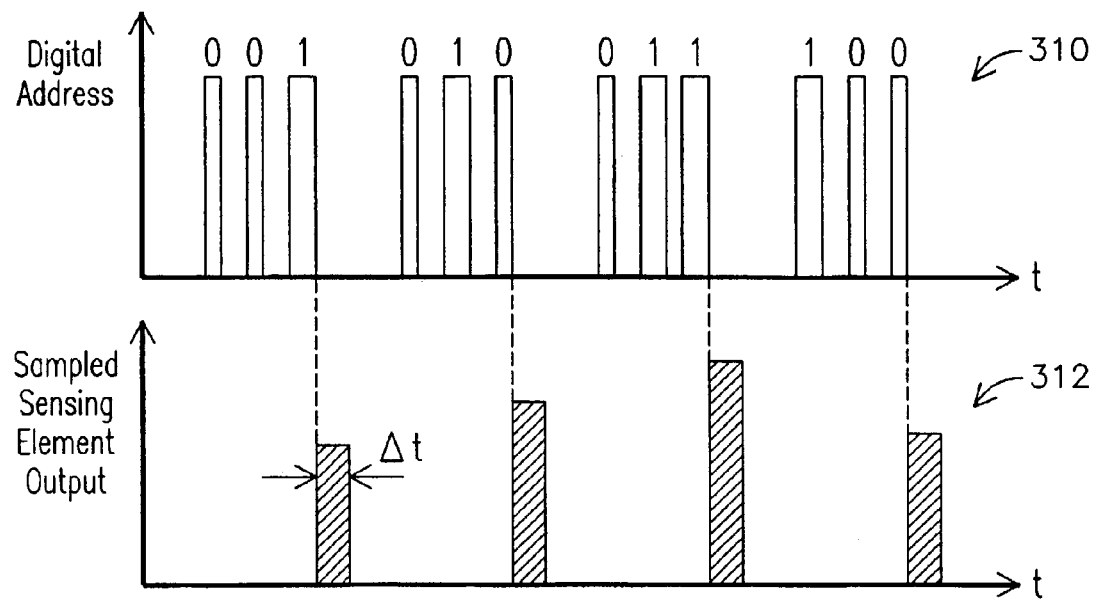
FIG. 5 illustrates a respective plot of an exemplary address signal for selecting an output signal from any sensing element of the sensor array and an exemplary output signal for the selected sensing element of the sensor array.

2. Once the address signal is received, the sensor array would output the signal for the selected sensing element. Again, the output signal could be in a digital serial format or may comprises a stream of analog samples 312 of a specified duration Δt (FIG. 5).

3. Once the sensor outputs a data sample, the multiplexer returns to its default state and waits for another address signal.

Figure 4:
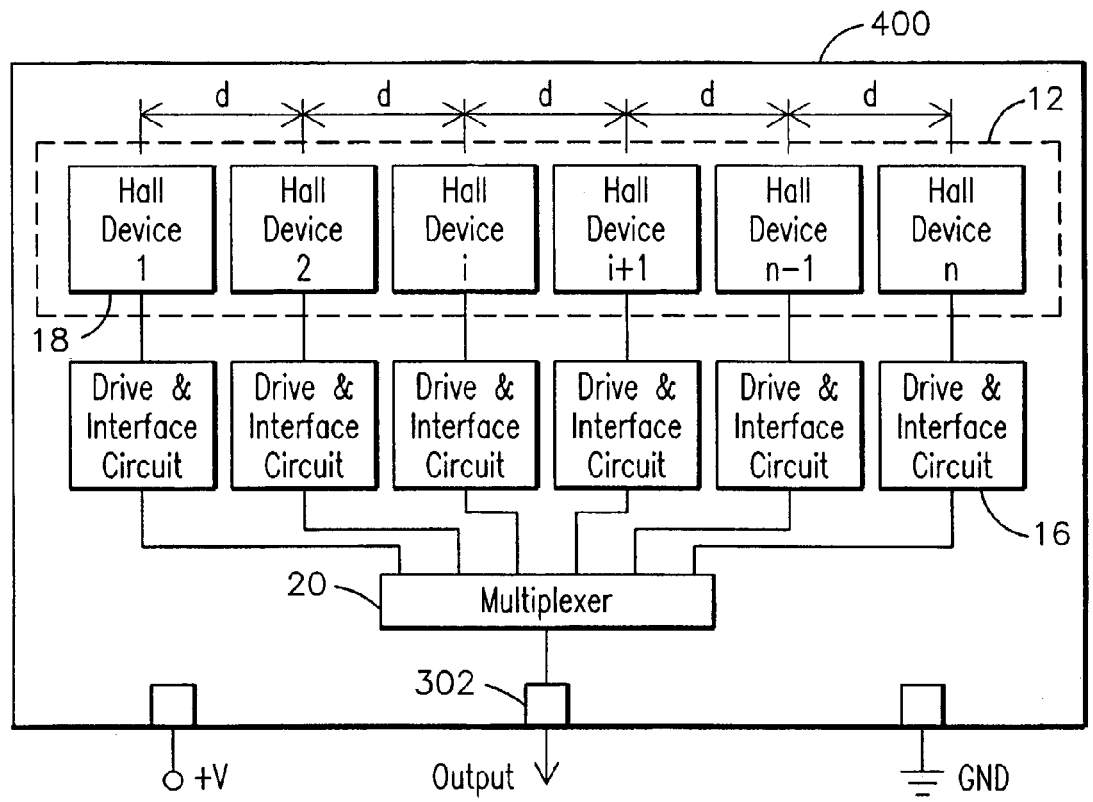
FIG. 4 is a schematic representation of yet another exemplary sensing interface arrangement that may be used to provide a continuous scanning technique, e.g., an interface technique not based on any external address selection.
Figure 6:
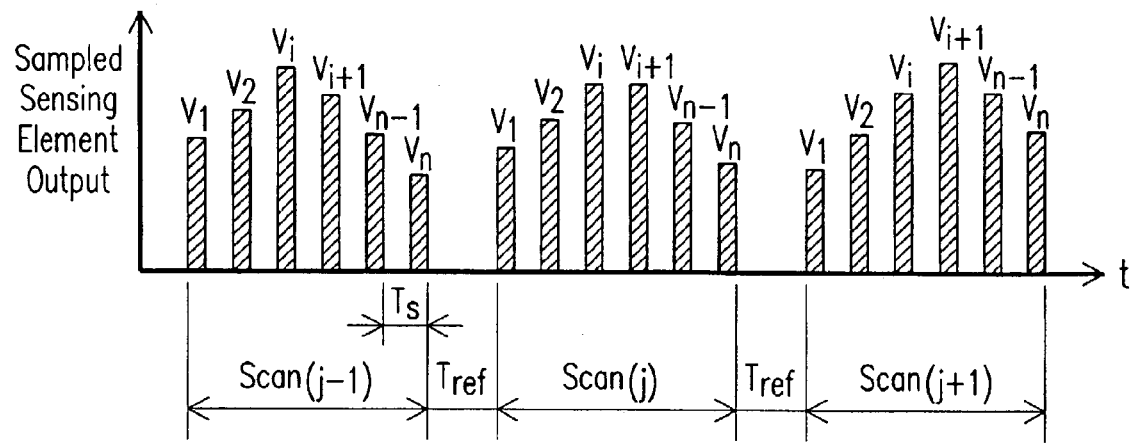
FIG. 6 illustrates an exemplary scan of samples that may be used by the interface arrangement of FIG. 4, wherein the scan of samples is configured to uniquely identify the specific array element that generated the corresponding output signal.

In the case of a continuous scanning technique, such as may be provided by the exemplary sensing interface arrangement 400 of FIG. 4. That is, an interface technique not based on any external address selection. In this arrangement one may use any of the following two synchronous interface techniques to uniquely identify the specific array element, which generated the corresponding output signal:

1. A pause Tref indicative of completion of each scan may be inserted between successive scans. The pause may be chosen to be sufficiently different than the time interval Ts between individual output samples within each scan (FIG. 6). After detection of the pause Tref, the DSP would be configured to keep count of the samples in a suitable register or counter. For example, the first sample (e.g., sample $V_1$) after the pause is detected may be associated with a first element of the sensor array. The second sample (e.g., sample $V_2$) after the pause is detected may be associated with a second element of the sensor array. In this manner one would be able to assign a respective sensor element to each sample within a scan.

Figure 7:
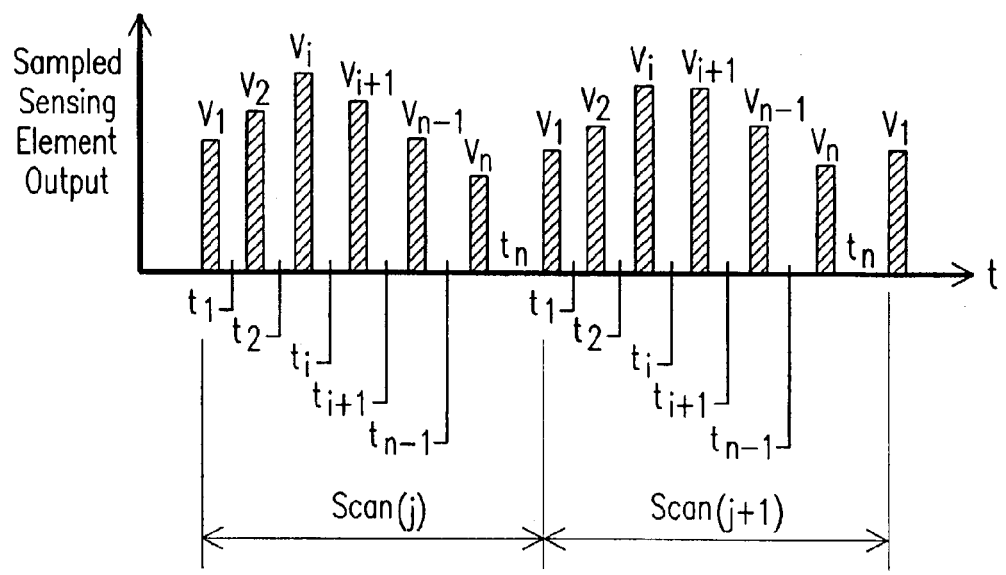
FIG. 7 illustrates another exemplary scan of samples that may be used by the interface arrangement of FIG. 4, wherein one assigns a unique time interval $t_i$ between each pair of successive output samples within each to uniquely identify the specific array element that generated the corresponding output signal.

2. One could assign a unique time interval $t_0$ between each pair of successive output samples within each scan (FIG. 7). Measuring the time interval between two consecutive samples would allow uniquely identifying the respective sensing element that generated a present sample. For example, assuming that the sensor array is made up of six sensors, and further assuming the time interval $t_1$ for identifying the first sensing element of the sensor array is 10 microseconds; that the time interval $t_2$ for identifying the second element of the sensor array is 20 microseconds; that the time interval $t_3$ for identifying the third sensing element of the sensor array is 30 microseconds, then each instance that a time interval of 10 microseconds elapses between any two successive samples, would indicate that the present sample corresponds to the first sensing element. Similarly, each instance that 20 microseconds elapses between any two successive samples, would indicate that the present sample correspond to the second sensing element. Each instance that 30 microseconds elapses between any two successive samples would indicate that the present sample corresponds to the third sensing element. Additional distinctive time intervals would be assigned for identifying samples from the remaining three sensing elements.

While the preferred embodiments of the present invention have been shown and described herein, it will be obvious that such embodiments are provided by way of example only. Numerous variations, changes and substitutions will occur to those of skill in the art without departing from the invention herein. Accordingly, it is intended that the invention be limited only by the spirit and scope of the appended claims.

What is claimed is:

1. A galvanomagnetic sensor array system comprising:
an array of galvanomagnetic elements, wherein at least three galvanomagnetic elements make up the array; and
a processor coupled to receive each output signal from the array of galvanomagnetic elements, wherein the processor and array of galvanomagnetic elements are integrated in a single semiconductor die;
a differential amplifier coupled to receive at a first terminal thereof a signal constituting the output signal from any selected one of the galvanomagnetic elements, the amplifier further coupled to receive at a second terminal thereof an offset signal selectable to remove bias that may be present in the output signal of the selected galvanomagnetic element.

2. The galvanomagnetic sensor array system of claim 1 wherein the amplifier is configured to provide variable gain amplification to the output signal from the selected galvanomagnetic element in response to a gain control signal from the processor.

3. The galvanomagnetic sensor array system of claim 2 further comprising an analogue-to-digital converter coupled to the amplifier to receive an amplified signal from the amplifier, wherein the gain imparted by the amplifier is selected to match the dynamic range of the sensor array relative to the range of the converter.

4. The galvanomagnetic sensor array system of claim 1 further comprising a multiplexer configured to select the output signal to be coupled to the amplifier in response to a sensor select signal from the processor.

5. A method for providing data interface between a galvanomagnetic sensor array integrated in a semiconductor die and an externally connected processor, the method comprising:
providing a pin in the die for passing to the externally connected processor a scan of samples from each galvanomagnetic element of the sensor array; and
configuring each scan of samples to uniquely associate each scan sample with a respective element of the sensor array wherein the configuring of each scan of samples comprises:
providing a variable time interval between any two successive samples, wherein the duration of the variable time interval is selected to uniquely identify the sensor element associated with the last sample of the two successive samples; and
uniquely identifying the sensor element associated with the last sample of any two successive samples based on the time interval measured between the two successive samples.

6. A method for providing data interface between a galvanomagnetic sensor array integrated in a semiconductor die and an externally connected processor, the method comprising:
- providing a pin in the die for passing to the externally connected processor a scan of samples from each galvanomagnetic element of the sensor array; and
- configuring each scan of samples to uniquely associate each scan sample with a respective element of the sensor array wherein the configuring of each scan of samples comprises:
  - providing a sample sequence uniquely indicative of each sensor element associated with each sample within a scan, the sample sequence recurring for each new scan;
  - assigning a time interval indicative of completion of a scan of samples, the assigned time interval being sufficiently distinct relative to the time interval between samples within each scan; and
  - identifying each sensor element associated with each sample within each new scan based on the recurring sample sequence for each new scan of samples.

7. A galvanomagnetic sensor array comprising:
an array of galvanomagnetic elements in a single semiconductor die, wherein the array contains at least three galvanomagnetic elements; and
interface structure constructed in the die for providing data interface between the galvanomagnetic sensor array and an externally connected processor, the interface structure comprising:
- a pin for passing to the externally connected processor a scan of samples from each galvanomagnetic element of the sensor array, wherein each scan of samples is processed by the externally connected processor to uniquely associate each scan sample with a respective element of the sensor array wherein the externally connected processor comprises:
  - a module for providing a variable time interval between any two successive samples, wherein the duration of the variable time interval is selected to uniquely identify the sensor element associated with the last sample of the two successive samples; and
  - a module for uniquely identifying the sensor element associated with the last sample of any two successive samples based on the time interval measured between the two successive samples.

8. A galvanomagnetic sensor array comprising:
an array of galvanomagnetic elements in a single semiconductor die, wherein the array contains at least three galvanomagnetic elements; and
interface structure constructed in the die for providing data interface between the galvanomagnetic sensor array and an externally connected processor, the interface structure comprising:
- a pin for passing to the externally connected processor a scan of samples from each galvanomagnetic element of the sensor array, wherein each scan of samples is processed by the externally connected processor to uniquely associate each scan sample with a respective element of the sensor array;

wherein the externally connected processor comprises:
- a module for providing a sample sequence uniquely indicative of each sensor element associated with each sample within a scan, the sample sequence recurring for each new scan;
- a module for assigning a time interval indicative of completion of a scan of samples, the assigned time interval being sufficiently distinct relative to the time interval between samples within each scan; and
- a module for identifying each sensor element associated with each sample within each new scan based on the recurring sample sequence for each new scan of samples.

* * * * *